(12) United States Patent
Myung et al.

(10) Patent No.: US 9,225,357 B2
(45) Date of Patent: Dec. 29, 2015

(54) DATA PACKET TRANSMISSION/RECEPTION APPARATUS AND METHOD

(71) Applicant: Samsung Electronics Co., Ltd., Gyeonggi-do (KR)

(72) Inventors: Seho Myung, Seoul (KR); Hyunkoo Yang, Seoul (KR); Sunghee Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 13/770,635

(22) Filed: Feb. 19, 2013

(65) Prior Publication Data

US 2013/0219240 A1  Aug. 22, 2013

Related U.S. Application Data

(60) Provisional application No. 61/600,064, filed on Feb. 17, 2012, provisional application No. 61/605,855, filed on Mar. 2, 2012.

(51) Int. Cl.
*H03M 13/00* (2006.01)
*H03M 13/05* (2006.01)
*H03M 13/37* (2006.01)

(52) U.S. Cl.
CPC ............ *H03M 13/05* (2013.01); *H03M 13/373* (2013.01)

(58) Field of Classification Search
USPC ........................................ 714/752
See application file for complete search history.

(56) References Cited

U.S. PATENT DOCUMENTS

| | | |
|---|---|---|
| 2003/0207696 A1 | 11/2003 | Willenegger et al. |
| 2008/0141094 A1 | 6/2008 | Vayanos et al. |
| 2009/0063928 A1 | 3/2009 | Gondo et al. |
| 2009/0327842 A1* | 12/2009 | Liu et al. ........................ 714/776 |
| 2010/0037278 A1 | 2/2010 | Yu et al. |
| 2010/0050057 A1* | 2/2010 | Luby .............................. 714/776 |
| 2011/0099449 A1 | 4/2011 | Li et al. |
| 2011/0258510 A1 | 10/2011 | Watson et al. |
| 2012/0042227 A1* | 2/2012 | Watson et al. ................. 714/776 |

OTHER PUBLICATIONS

Author: U. Tuntoolavest; Title: Simple Method to Improve the Performance of Convolutional Vector Symbol Decoding With Small Symbol Size; Date: 2004; Publisher: IEEE; Edition: 0-7803-8560-8/04.*
Sunghee Hwang et al., D1-FEC EE Samsung Proposal, International Organisation for Standardisation, ISO/IEC JTC1/SC29/WG11, MPEG2011/M21539, Nov. 2011, 30 pages.
European Search Report dated Sep. 4, 2015 issued in counterpart application No. 13749181.7-1906, 15 pages.

* cited by examiner

*Primary Examiner* — April Y Blair
*Assistant Examiner* — Thien D Nguyen
(74) *Attorney, Agent, or Firm* — The Farrell Law Firm, P.C.

(57) ABSTRACT

A method and apparatus are provided for recovering data efficiently even when data loss has occurred over a channel or network. The packet transmission method includes arranging a first transmission packet in a source symbol in a first region of a source block; arranging a second transmission packet in a space starting with an empty space of a last source symbol where the first transmission packet is arranged, remaining after arranging the first transmission packet; arranging information related to the second transmission packet in a second region of the source block; performing Forward Error Correction (FEC) encoding on the source block; and transmitting the encoded source block.

8 Claims, 17 Drawing Sheets

201
UDP Flow ID

202
LENGTH INFORMATION ON DATA PACKET TO BE PROTECTED

203
PACKET DATA TO BE PROTECTED 204
zero-padding

205
Parity data

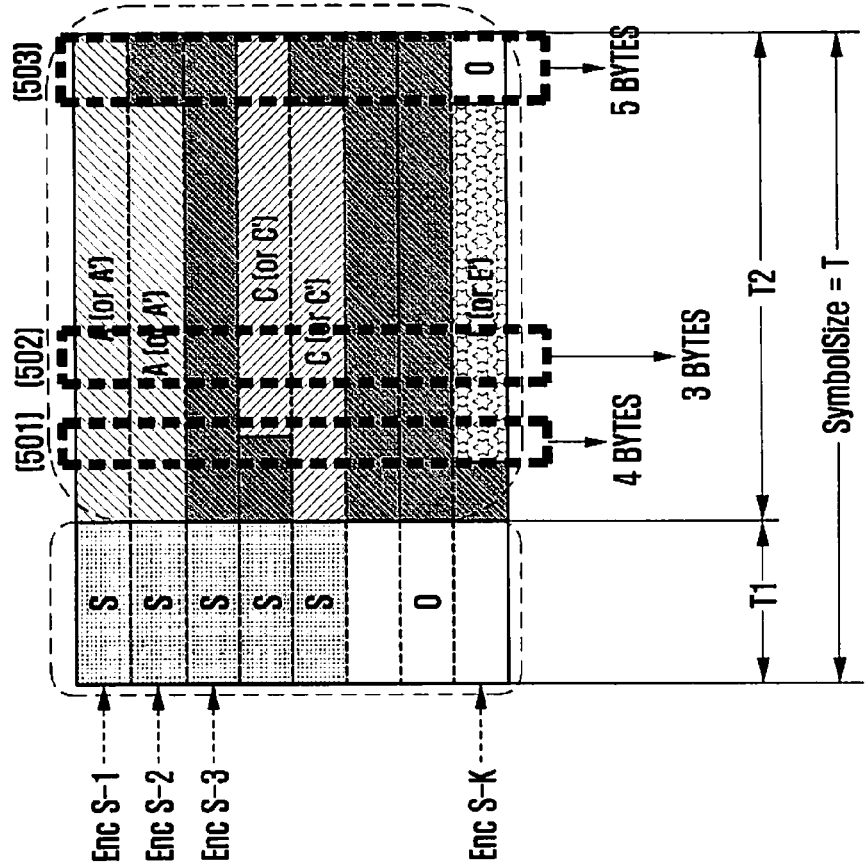

DATA PACKET TRANSMISSION/RECEPTION APPARATUS AND METHOD

PRIORITY

This application claims priority under 35 U.S.C. §119 to U.S. Provisional Application Nos. 61/600,064 and 61/605,855, which were filed in the United States Patent and Trademark Office on Feb. 17, 2012 and Mar. 2, 2012, respectively, the entire disclosure of each of which is hereby incorporated by reference.

BACKGROUND OF THE INVENTION

1. Field of the Invention

The present invention relates generally to data transmission/reception in a broadcast or communication system, and in particular, to a method and apparatus for efficiently recovering data, even when data loss has occurred over a channel or network.

2. Description of the Related Art

With the increased consumption of multimedia content, e.g., high capacity multimedia data such as High Definition (HD) and Ultra High Definition (UHD) content, network data congestion is more common, which deteriorates broadcast and communication environments.

Consequently, content data transmitted by a sender (e.g., a Host A) may not be normally delivered to a receiver (e.g., Host B), resulting in data loss on a routing path. In many cases, data is transmitted in packets, and thus, data loss also occurs in packets. The data loss on the network causes data packet reception failure of the receiver. Further, it is difficult for the receiver to recover the data carried in the missing packet. As a result, the missing packets cause audio and video quality degradation with various mal-effects (such as a cracked screen, missing subtitle, file loss, etc.), thereby inconveniencing a user.

A well-known missing data recovery technique is to group data packets, i.e., source packets, with various lengths into source blocks and add repair information, i.e., parity bits or repair packets, to the source blocks thorough Forward Error Correction (FEC) encoding. When there is missing data, the receiver is then capable of decoding the original data using the repair information.

However, when the length of the source packets constituting the source block is variable, the source block may be partially filled with zero padding, and sometimes, a relatively large amount of zero padding, depending on the source block configuration and packet length. The zero padding carries no information but increases the number of symbols in the source block, which gives the same effect of transmitting unnecessary parity.

SUMMARY OF THE INVENTION

The present invention has been made in view of the above-described problems occurring in the prior art, and provides at least the advantages described below.

Accordingly, an aspect of the present invention is to provide a method and apparatus for transmitting and receiving packet data in a broadcast and communication system.

Another aspect of the present invention is to provide a method and apparatus for efficiently recovering source data, when data loss has occurred in a broadcast or communication system.

Another aspect of the present invention is to provide a method and apparatus for efficiently configuring a source block that improves error correction capability while reducing zero padding in a broadcast or communication system.

In accordance with an aspect of the present invention, a packet transmission method is provided, which includes arranging a first transmission packet in a source symbol in a first region of a source block; arranging a second transmission packet in a space starting with an empty space of a last source symbol where the first transmission packet is arranged, remaining after arranging the first transmission packet; arranging information related to the second transmission packet in a second region of the source block; performing FEC encoding on the source block; and transmitting the encoded source block.

In accordance with another aspect of the present invention, a packet transmission apparatus is provided, which includes a source block generator that arranges a first transmission packet in a source symbol in a first region of a source block, arranges a second transmission packet in a space starting with an empty space of a last source symbol where the first transmission packet is arranged, remaining after arranging the first transmission packet, and arranges information related to the second transmission packet in a second region; an Forward Error Correction (FEC) encoder that performs FEC encoding on the source block; and a transmitter that transmits the encoded source block.

In accordance with another aspect of the present invention, a packet reception method is provided, which includes receiving a source block; performing Forward Error Correction (FEC) decoding on a first region of the source block; acquiring information related to a reception packet, as a result of decoding the first region; acquiring arrangement information of the reception packet from a second region of the source block using the information related to the reception packet, the reception packet being arranged in a space starting with an empty space of a last source symbol where a previous reception packet is arranged, remaining after arranging a previous reception packet in a source symbol; performing FEC decoding on the second region; and acquiring the reception packet as a result of decoding the second region using the arrangement information from the second region.

In accordance with another aspect of the present invention, a packet reception apparatus is provided, which includes a receiver that receives a source block; an Forward Error Correction (FEC) decoder that performs FEC decoding on a first region of the source block; a source block analyzer that acquires arrangement information of a reception packet from a second region of the source block using the information of the reception packet, the reception packet being arranged in a space starting with an empty space of a last source symbol where a previous reception packet is arranged, remaining after arranging a previous reception packet in a source symbol. The FEC decoder further performs FEC decoding on the second region of the source block, and the source block analyzer further acquires the reception packet as a result of decoding the second region using the arrangement information from the second region.

BRIEF DESCRIPTION OF THE DRAWINGS

The above and other aspects, features, and advantages of certain embodiments of the present invention will be more apparent from the following detailed description in conjunction with the accompanying drawings, in which:

FIGS. 5A and 5B illustrate source blocks with source symbol loss according to an embodiment of the present invention;

DETAILED DESCRIPTION OF EMBODIMENTS OF THE INVENTION

Various embodiments of the present invention are described in detail below with reference to the accompanying drawings. The same reference numbers are used throughout the drawings to refer to the same or like parts. Additionally, detailed descriptions of well-known functions and structures incorporated herein may be omitted to avoid obscuring the subject matter of the present invention.

Further, the terms used herein are generally defined by taking functions of the present invention into account and can be changed according to the practice or intention of users or operators. Therefore, definition of the terms should be made according to overall disclosures set forth herein.

The embodiments of the present invention to be described below propose methods for efficiently recovering data packet loss, which may be applied to a mobile terminal, a Television (TV), a computer, an electronic slate, a tablet Personal Computer (PC), electronic book, etc., which use various multimedia services, such as high capacity content (including HD and UHD content) streaming and video conference/call services.

Some of the embodiments of the present invention described herein provide methods for improving decoding performance and transmission efficiency by efficiently configuring the source block with the application of FEC to the data packets.

Although embodiments of the present invention will be described below using an FEC encoding method, the embodiments of the present invention are also applicable to systems using a Reed-Solomon (RS) code, a Low Density Parity Check (LDPC) code, a Turbo code, a Raptor code, a RaptorQ code, a Single Parity-Check Code, a Moving Picture Experts Group (MPEG) FEC code, etc.

Figure 1A:
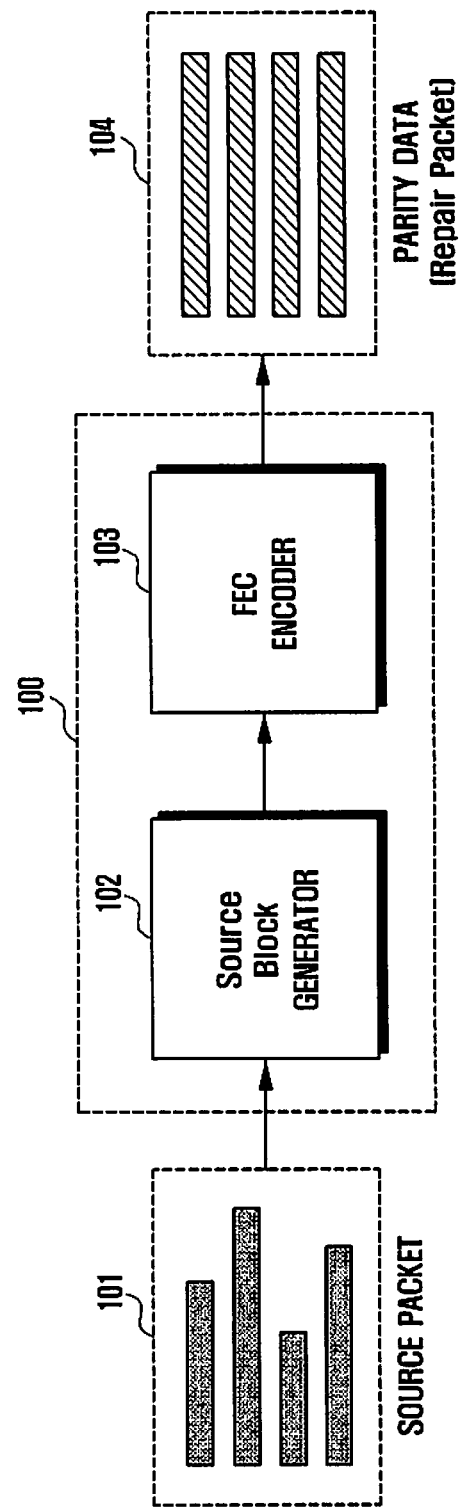
FIG. 1A illustrates a transmission apparatus according to an embodiment of the present invention.

FIG. 1A illustrates a transmission apparatus according to an embodiment of the present invention.

Referring to FIG. 1A, the transmission apparatus 100 includes a source block generator 102 and an FEC encoder 103. The transmission apparatus 100 also includes a transmitter (not shown).

The source block generator 102 configures a plurality of source packets 101 into a source block. The FEC encoder 103 adds repair information, such as parity data and a repair packet, by applying FEC. The transmitter transmits the source block having the repair information 104. The source packets 101 are data packets having a variable length.

Figure 1B:
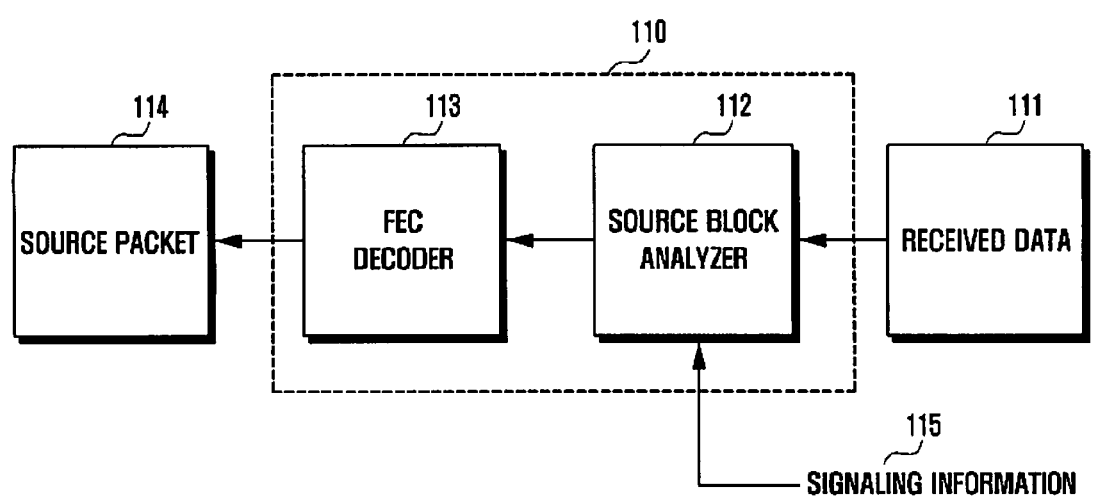
FIG. 1B illustrates a reception apparatus according to an embodiment of the present invention.

FIG. 1B illustrates a reception apparatus according to an embodiment of the present invention.

Referring to FIG. 1B, the reception apparatus 110 includes a source block analyzer 112 and an FEC decoder 113. The reception apparatus 110 also includes a receiver (not shown).

The receiver receives data 111 and transfers the received data to the source block analyzer 112. The source block analyzer 112 processes the source block carrying the data 111 into source symbols having repair information. The FEC decoder 113 performs FEC decoding on the source symbols to recover the source packets 114. The source block analyzer 112 recovers the missing data using the signaling information 115, which may be received with the data 111 or separately.

Figure 2:
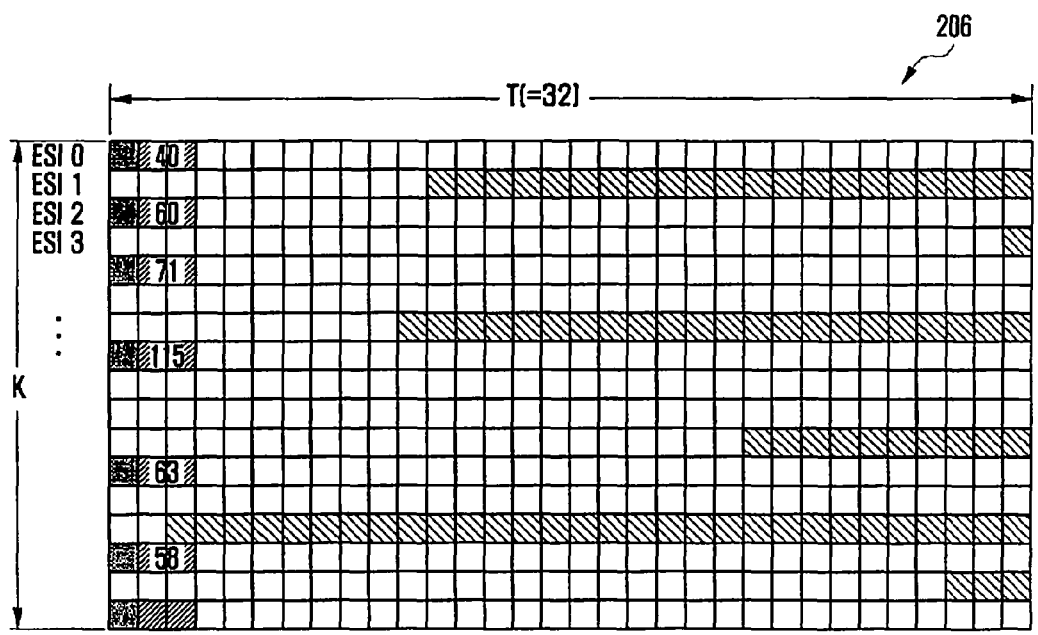
FIG. 2 illustrates a conventional source block for use in a data packet transmission method.
Figure 2:

FIG. 2 illustrates a conventional source block for use in a data packet transmission method.

Referring to FIG. 2, source packets are sequentially arranged in a 2-dimensional array having a predetermined width of T. Each row of the array is referred to as symbol, and T is also referred to as a symbol size. Typically, a symbol size is expressed in units of bytes or bits. Further, the FEC is applied per packet.

Referring to FIG. 2, the source block generator 102 adds a data packet Flow IDentifier (Flow ID) 201 and packet length information 202 to a source packet 203, and sequentially arranges the source packets 203 from the first row and first column, without exceeding the limit of the symbol size T. Unless otherwise stated, the length information 202 of the source packet is expressed in unit of byte.

Alternatively, one of the Flow ID 201 and the packet size information 202 may be selectively included according to the system, or both the Flow ID 201 and packet length information 202 can be omitted.

The source packets including the extra informations 201 and 202 are sequentially arranged from the first row and first column, and if the source packet length including the extra informations 201 and 202 is not a multiple of T, an empty part of the last row in which the source packet is arranged is filled with zero padding 204. After completing the above-described process to the source packets 203, the array of K rows is referred to as a source block 206.

The K rows of the source block 206 can be regarded as K source symbols to which FEC encoding is applied, and the K source symbols are generated into the repair (or parity) symbols 205 or 207 with the application of the FEC encoding. Herein, the source symbols and repair symbols are commonly referred to as encoding symbols.

When configuring the source block 206, as described above, a large amount of zero padding may be inserted. Therefore, in accordance with an embodiment of the present invention, a source block configuration method is proposed, which improves error correction capability while reducing the amount of zero padding.

Figure 3A:
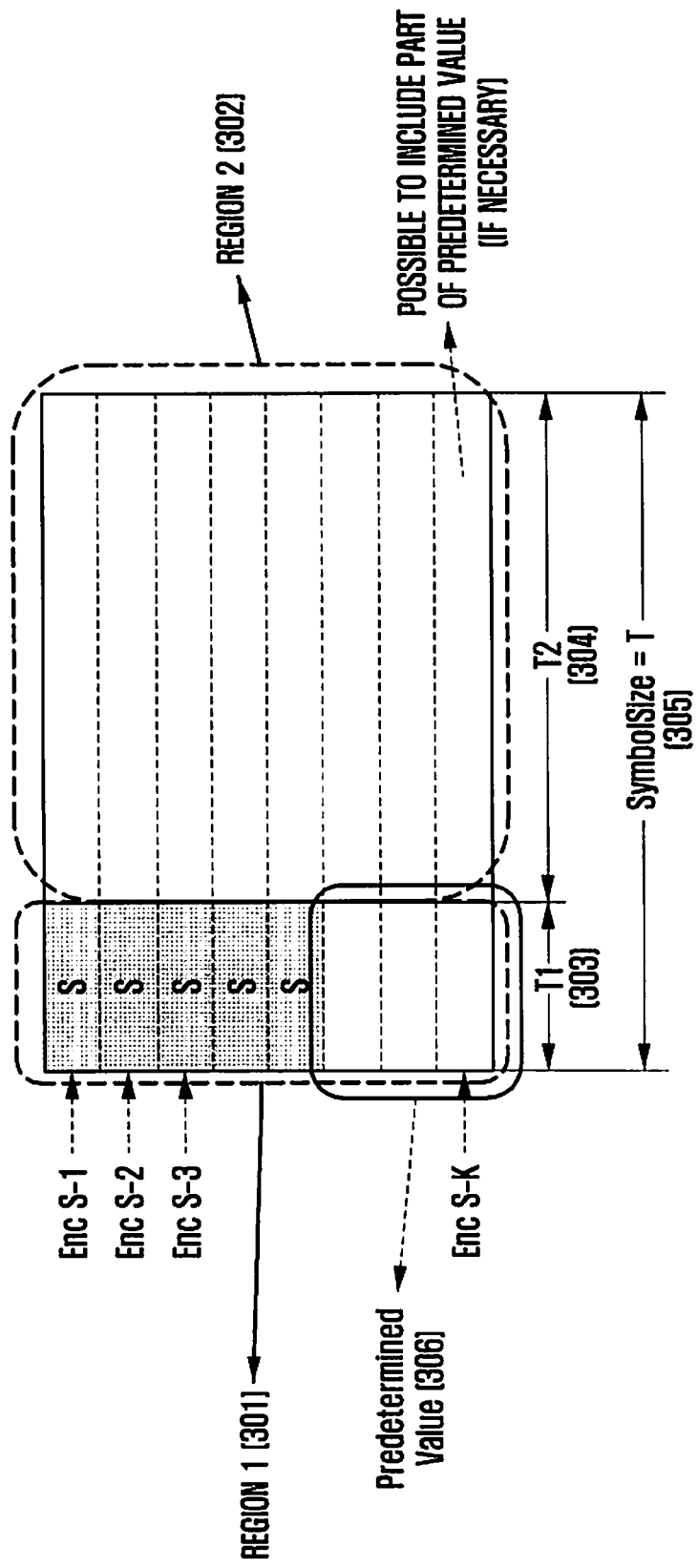
FIGS. 3A and 3B illustrate a source block configuration mechanism according to embodiments of the present invention.
Figure 3B:
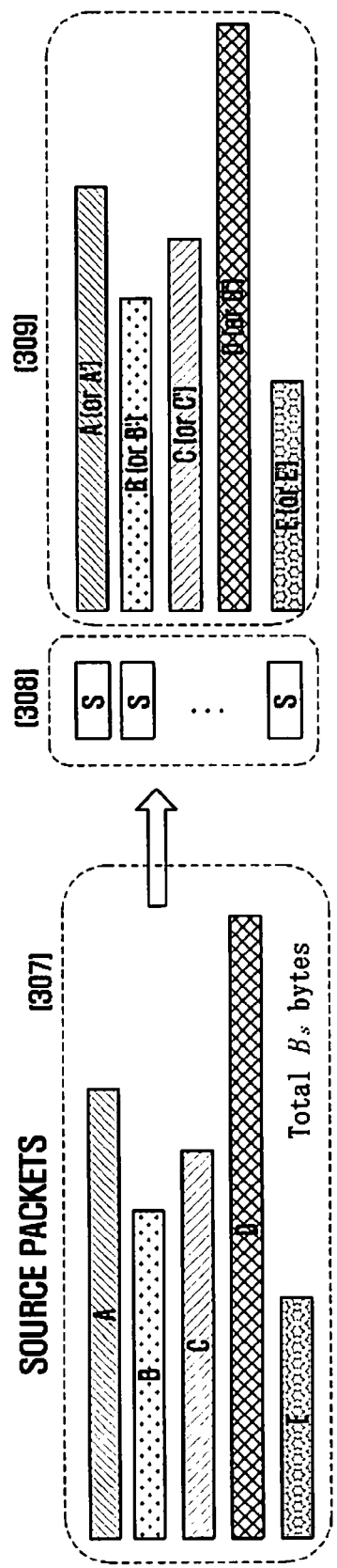

FIGS. 3A and 3B illustrate a source block configuration mechanism according to embodiments of the present invention.

Referring to FIG. 3A, a source block is divided into a region 1 301, which has T1 columns 303, and a region 2 302, which has T2 columns 302. The regions 1 301 and 2 302 are arranged with different characteristics.

Unless otherwise stated, the number of columns of each region means the number of bytes of a partial source symbol of each region, however is not limited thereto. Further, each row denotes a source symbol, and the rows of each region can be defined as partial source symbols.

The region 1 301 corresponds to the region of partial source symbols having the size of T1 303, and the region 2 302 corresponds to the region of partial source symbols having the size of T2 304. The number of the partial source symbols in the region 1 301 is K. The number of the partial source symbols in the region 2 302 is K. K is a value which can be flexibly changed.

Accordingly, the source block of illustrated in FIG. 3A corresponds to T source symbols having a relationship of T1+T2=T.

Although FIG. 3A illustrates a source block of a 2-dimensional array of symbols being divided into two regions having the partial symbol sizes of T1 303 and T2 304, the source block can be divided into more than two regions.

The data arranged in a respective region of a source block can be divided according to a rule of arranging extra information in a given packet and data in the region.

Referring to FIG. 3B, the source block generator 102 extracts extra information, such as a Flow ID and length information of the source packets 307, and/or partial data of the source packets 307 to generate the data 308 to be arranged in the region 1 301. The source block generator 102 maps the data 309 to the region 2 302, with the exception of some information on the source packet 307, which is included in the data 308 to be arranged in the region 1 301.

The source packet 307 and data 309 can be different from each other. For example, a part of the source packet 307 can be used as the data 309. However, in many cases, the whole source packet 307 can be used as the data 309. The data 309 can be arranged in the region 2 302.

Although, in the embodiments described herein, the region 1 301 carries the data for the extra information on the source packets 307 to be arranged in the region 2 302 and some information of the source packet 307 is not included in the data 308 to be arranged in the region 1 301, the scope of the present invention is not limited thereto.

Figure 4:
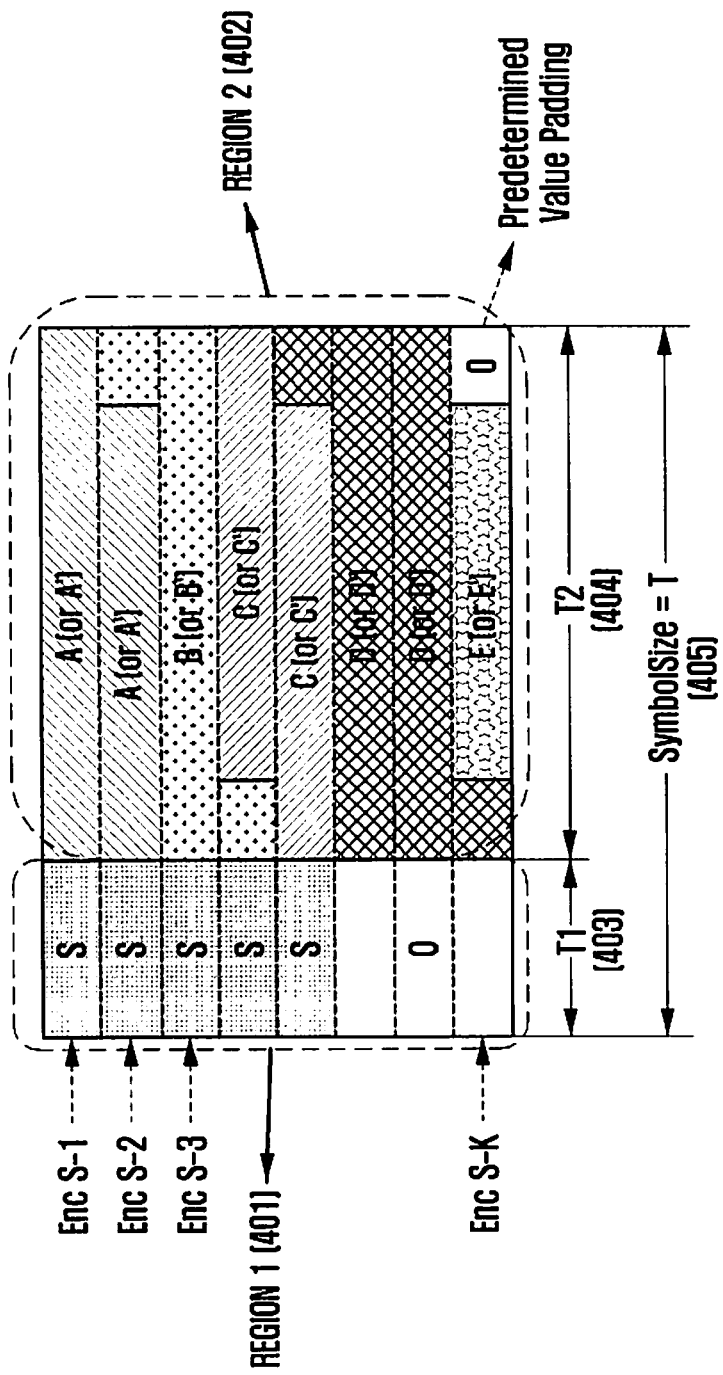
FIG. 4 illustrates a data packet arrangement mechanism for a packet transmission method according to an embodiment of the present invention.

FIG. 4 illustrates a data packet arrangement mechanism for use in a packet transmission method according to an embodiment of the present invention. Specifically, FIG. 4 illustrates a method of arranging data packet corresponding to data 309 (or packets 307) in the region 2 302.

The data packet arrangement rules of FIG. 4 can be summarized as follows.

<Rule 1>

The source block generator 102 arranges, in region 1 401, information S indicating a length of each source packet, or portion thereof, to be mapped to the region 2 402, as a specific part of the encoding symbol. The source block generator 102 fills any remaining space with the predetermined value, e.g., 0's. The arrangement pattern may vary according to the size of T1.

<Rule 2>

The source block generator 102 arranges the source packets or partial source packets in the region 2 402, without exceeding a limit of the region. Once all of the source packets have been arranged, any remaining space in region 2 402 is padded with a predetermined value, e.g., 0's.

Referring to FIG. 4, data packets are sequentially arranged without zero padding, unlike the method as described with reference to FIG. 2. If a source packet is arranged with empty space in the last source symbol, the next source packet is arranged subsequently. However, the last empty part of the region 2 402 may be filled with zero padding.

According to the arrangement scheme illustrated FIG. 4, because there is no zero padding between data packets, it is possible to minimize the transmission of unnecessary data in region 2 402. Accordingly, assuming that the same source packets are given, the number of source symbols K can be reduced dramatically, as compared to the method illustrated in FIG. 2.

However, the data packet arrangement method illustrated in FIG. 4 still has a shortcoming in that the partial source symbol unit loss increases. Here, the partial source symbol unit loss indicates that if a part of data is lost in a partial source symbol, the whole source symbol is lost.

Figure 5A:
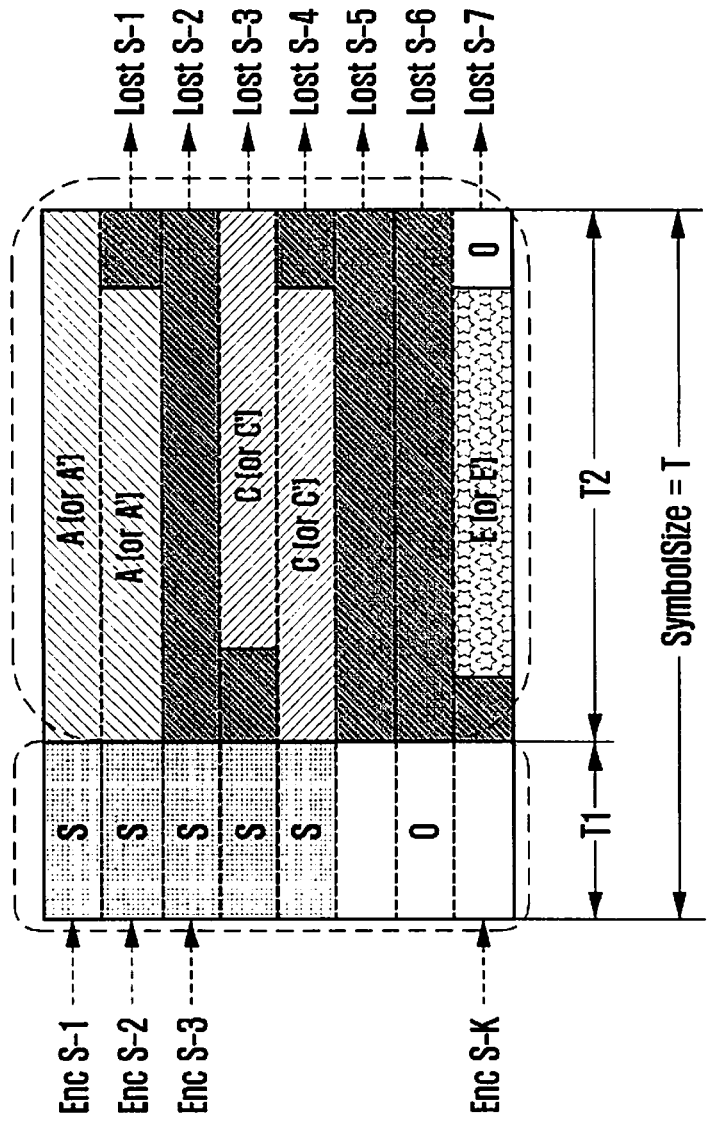

FIGS. 5A and 5B illustrate source blocks with source symbol loss according to an embodiment of the present invention.

Assuming that the second and fourth source packets B and D are missing, when using the example illustrated in FIG. 3B, the number of missing partial source symbols (by row) is 7 (Lost S-1 to Lost S-7) in FIG. 5A. For reference, the number of missing partial source symbols is 5, when the conventional arrangement method of FIG. 2 is applied. Accordingly, when the FEC decoding on region 2 402 is performed in unit of partial source symbol, decoding is performed in consideration of the 7 missing symbols. As a result, when the data packet arrangement method illustrated in FIG. 4 is applied to the region 2 402, the performance degradation probability increases.

Referring to FIG. 5B, if the packet missing is counted in units of bytes, the lost packets are 4 in the region 501, 3 in the region 502, and 5 in the region 3. That is, if the FEC decoding is configured with the unit of byte, up to 5 missing bytes may occur in the worst case, resulting in superior performance, as compared with the FEC decoding in unit of symbol.

The worst case number of missing packets in units of bytes, according to the arrangement method of FIG. 5B is 5, which is equal to that of missing packets in units of the partial source symbols in the method of FIG. 2. However, the worst case number of missing packets in units of bytes according to the arrangement methods illustrated in FIGS. 4, 5A, and 5B is reduced dramatically, as compared to the number of missing packets in units of partial source symbol units, according to the conventional arrangement method of FIG. 2.

When arranging the data packets at the region 2 402, as illustrated in FIG. 4, the number of source symbols decreases due to the reduction in the amount of zero padding and the number of lost packets in units of bytes decreases too. Consequently, the FEC decoding in units of bytes improves decoding performance. Improved performance means that less redundancy is necessary to achieve the same performance. Therefore, the number of repair packets transmitted is reduced, so the transmission overhead is reduced.

The FEC decoding in units of partial source symbols to the region 2 402 is advantageous in that the FEC decoding is simple, due to the regular error pattern from the partial source symbol unit viewpoint. However, the FEC decoding in units of bytes also shows an irregular error pattern in the entire region 2 402, and thus, has complex FEC decoding process, resulting in increase of the decoding complexity.

Figure 6:
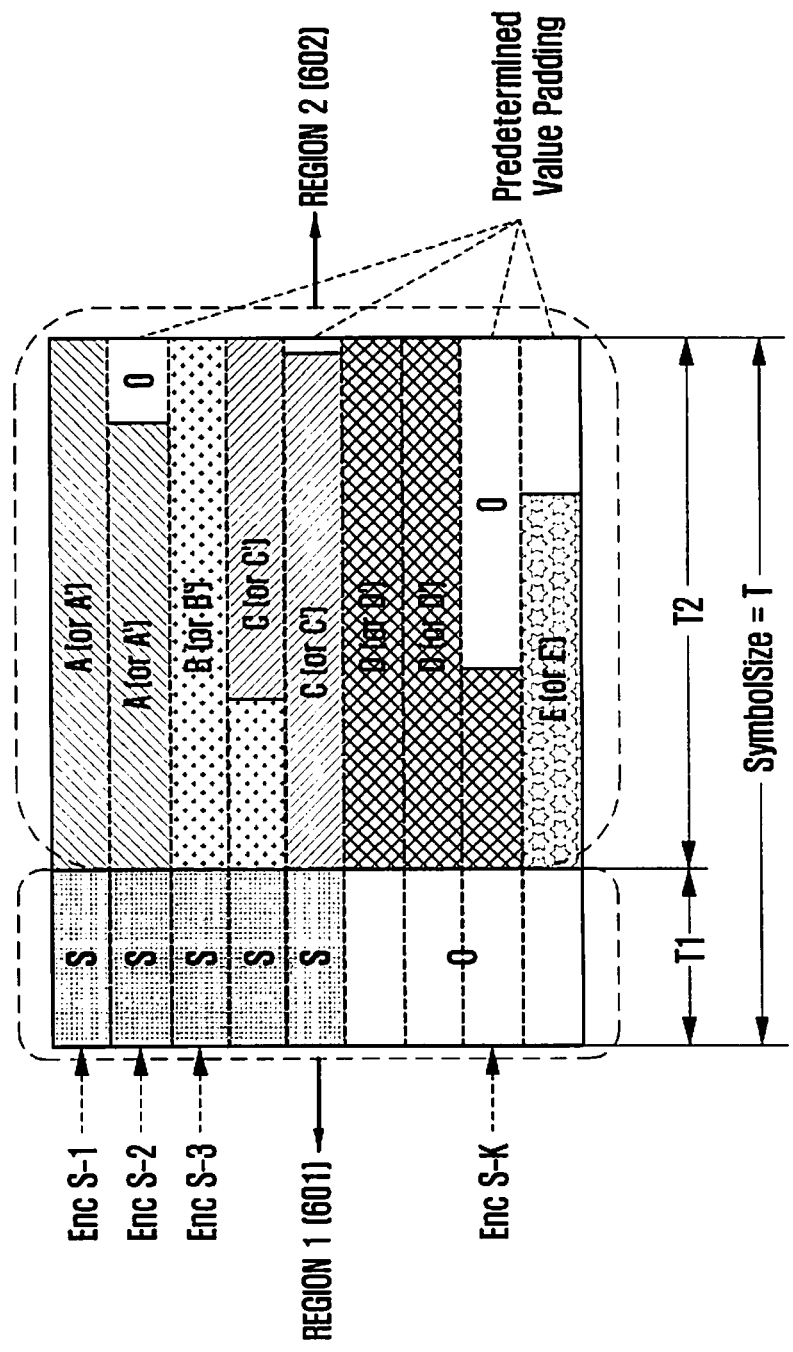
FIG. 6 illustrates a source block configuration according to an embodiment of the present invention.

FIG. 6 illustrates a source block configuration according to an embodiment of the present invention. The description regarding FIGS. 3A and 3B is also applied in FIG. 6.

In order to overcome the shortcoming of the arrangement method of FIG. 4, i.e., an increase of the decoding complexity, despite the performance improvement, the source block configuration method illustrated in FIG. 6 in provided.

The data packet arrangement rules of FIG. 6 can be summarized as follows.

<Rule 3>

The source block generator 102 arranges information S indicating a length of each source packet, or a portion thereof, to be mapped to region 2 602 in region 1 601, as a specific part of each encoding symbol. Any remaining empty is then padded with predetermined values, e.g., 0's. The arrangement pattern may vary according to the size of T1.

As described above, region 1 601 may also include extra supplementary information, such as a Flow ID and length information, and/or some data of source packets.

<Rule 4>

The source block generator 102 arranges the source packets or partial source packets in the region 2 620, without exceeding a limit of the region. The first source packet or partial source packet is arranged at the beginning of the region 2 602. The next and following source packets or partial source packets are arranged differently depending on the arrangement of the previous source packet or partial source packet according to Rules 4A to 4D below.

4A) The source block generator 102 counts a number of partial source symbols (number of additionally required rows) for the region 2 602 that occur additionally, when the following source packet or partial packet is arranged in the space starting from the empty space of the last partial source symbol where the previous source packet or partial source packet is arranged.

4B) The source block generator 102 counts a number of partial source symbols (number of additionally required rows) for the region 2 602 that occur additionally when the next and following source packets or partial source packets are arranged from the start point of the next partial source symbol subsequent to the last partial source symbol in the region 2 602, corresponding to the previously arranged source packet or partial source packet.

4C) The source block generator 102 arranges the source packets or partial source packets according to Rule 4B) when the numbers of additional partial source symbols counted according to Rules 4A) and 4B) are equal to each other.

4D) The source block generator 102 pads the remaining empty space after arranging all source packets in the region 2 620 with predetermined values, e.g., 0's.

A description will now be made of a source packet or partial source packet arrangement procedure with reference to FIG. 6.

Referring to FIG. 6, when arranging the second source packet B or partial second source packet B' after the first source packet A or partial first source packet A' according to Rule 4A, the number of partial source symbols increases by 2 in the region 2 602.

When arranging the second source packet B or partial second source packet B' at the row next to the row where the first source packet A or partial first source packet A' is arranged, as illustrated in FIG. 6, according to Rule 4B, the number of partial source symbols increases by 2 in the region 2 602. That is, because the increased numbers of partial symbols in the former and latter cases are equal to each other, the second source packet B or partial second source packet B' is arranged in the source symbol (next row) following the source symbol in which the first source packet A or partial first source packet A' is arranged, as illustrated in FIG. 6.

When arranging the third source packet C or partial third source packet C' after the second source packet B or partial second source packet B', according to Rule 4A, the number of partial source symbols increases by 1 in the region 2 602.

When arranging the third source packet C or partial third source packet C' at the row next to the row where the second source packet B or partial second source packet B' is arranged, as illustrated in FIG. 6, according to Rule 4B, the number of partial source symbols increases by 2 in the region 2 602. That is, because the increased number of partial source symbols in the former case is less than that in the latter case, the third source packet C or the partial third source packet C' is arranged after the second source packet B or partial second source packet B', as illustrated in FIG. 6.

When arranging the fourth source packet D or partial fourth source packet D' after the third source packet C or partial third source packet C', according to Rule 4A, the number of partial source symbols increases by 3 in the region 2 602.

When arranging the fourth source packet D or partial fourth source packet D' at the row next to the row where the third source packet C or partial third source packet C' is arranged, as illustrated in FIG. 6, according to Rule 4B, the number of partial source symbols increases by 3 in the region 2 602. That is, because the increased number of partial source symbols in the former case is less than that in the latter case, the third source packet C or the partial third source packet C' is arranged after the second source packet B or partial second source packet B', as illustrated in FIG. 6. That is, because the increased number of partial symbols in the former and latter cases are equal to each other, the fourth source packet D or partial fourth source packet D' arranged in the source symbol (next row) next to the source symbol in which the third source packet C or partial third source packet C' is arranged, as illustrated in FIG. 6.

Similarly, the fifth source packet E or partial fifth source packet E' is arranged in the source symbol next to the source symbol in which the fourth source packet D or partial fourth source packet C' is arranged, as illustrated in FIG. 6.

Because the data packet arrangement method illustrated in FIG. 6 selectively inserts zero padding after each packet, the number of source symbols K increases a little more than in the arrangement method illustrated in FIG. 4. However, the amount of zero padding decreases dramatically when compared to the arrangement method illustrated in FIG. 2, considerably reducing the number of source symbols.

Figure 7:
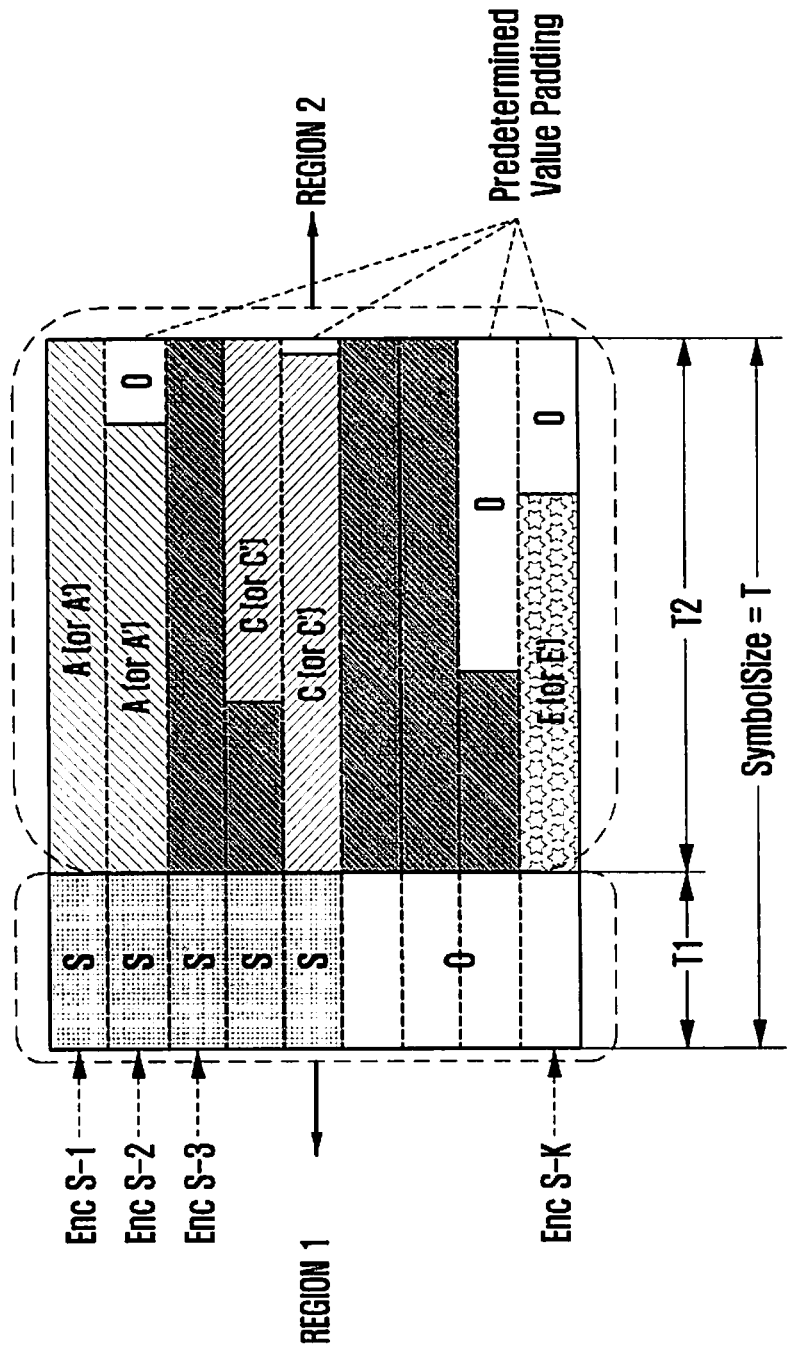
FIG. 7 illustrates source symbol loss in a source block configuration according to an embodiment of the present invention.

FIG. 7 illustrates source symbol loss in a source block configuration according to an embodiment of the present invention.

Referring to FIG. 7, the second source packets B and the fourth source packet D of FIG. 3B are lost during the transmission. However, unlike the case illustrated in FIG. 5 in which 7 partial source symbols are lost, the number of lost partial source symbols is 5 in FIG. 7, like the arrangement of FIG. 2. Accordingly, although the decoding is performed in units of symbols in FIG. 7, there is little difference between the packet arrangements of FIGS. 2 and 6.

According to the method of FIG. 6, the number of source symbols can be reduced by applying zero padding, or not, according to rule 4. Further, the data packet arrangement method illustrated in FIG. 6 with FEC decoding in units symbols has no performance degradation, because the symbol loss of FIG. 6 is almost equal to that of FIG. 2. If the FEC decoding in units of symbols is applied, accepting an increase of decoding complexity, it is possible to reduce the loss in units of bytes, resulting in improved performance. Accordingly, the method illustrated in FIG. 7 is advantageous in that the decoding scheme can be selected in consideration of the trade-off relationship between the decoding complexity and performance.

Hereinafter, a description is made of the method for arranging the supplementary information such as Flow ID and Length information on the source packets 307 and the data 308 acquired by extracting some data of the source packet 307 in the data region 1 301.

After completing the arrangement of data in the region 2 302 having size T2 304, if the number of partial source symbols is K, the number of partial source symbols in the region 1 301 having the size T1 is also K. Assuming the total size of the data 308 to be arranged in the region 1 301 is N_Total_Data1, if the value of N_Total_Data1 is less than K*T1, the region 1 301 is filled with a large amount of redundant data. Typically, the region 1 301 requires high robustness, as compared to the region 2 302, and thus, zero-padded data is often required. However, if the amount of zero-padded data is excessive, it defeats the purpose of reducing the zero padding as one of the objects of the present invention. Accordingly, when K and N_Total_Data1 are given, T1 should be adjusted appropriately to restrict the difference between N_Total_Data1 and K+T1 within a certain range.

According to an embodiment of the present invention, the T1 value is determined as follows.

When the minimum limit ratio of the redundant data 306, such as zero padding, for securing robustness in the region 1 301 required by the system to the total data amount available in the region 1 301 is R_padding, because the data at the zero-padded position can be used as known information at the receiver for FEC decoding, the robustness increases as the zero-padded data amount increases. However, because the zero-padded data increases the redundancy in the source block, the resource efficiency decreases. As a consequence, a relationship as shown in Equation (1) is set.

$$(K \times T1 - N\_Total\_Data1)/K \times T1 \geq R\_padding$$

$$T1 \geq N\_Total\_Data1/((1-R\_padding) \times K) \quad (1)$$

In Equation (1), the T1 value fulfills the inequality (2) to secure the robustness required by the system for the region1 301. However, because the resource efficiency of the source block decreases while the robustness increases in proportion to T1, it is reasonable to set T1 to a minimum integer fulfilling the inequality (1).

For example, if N_Total_Data1=2,400 bytes, R_padding=0.2, and K=950; T1≥2400(1−0.2)×950=(about) 3.16 and thus T1=4.

Figure 8:
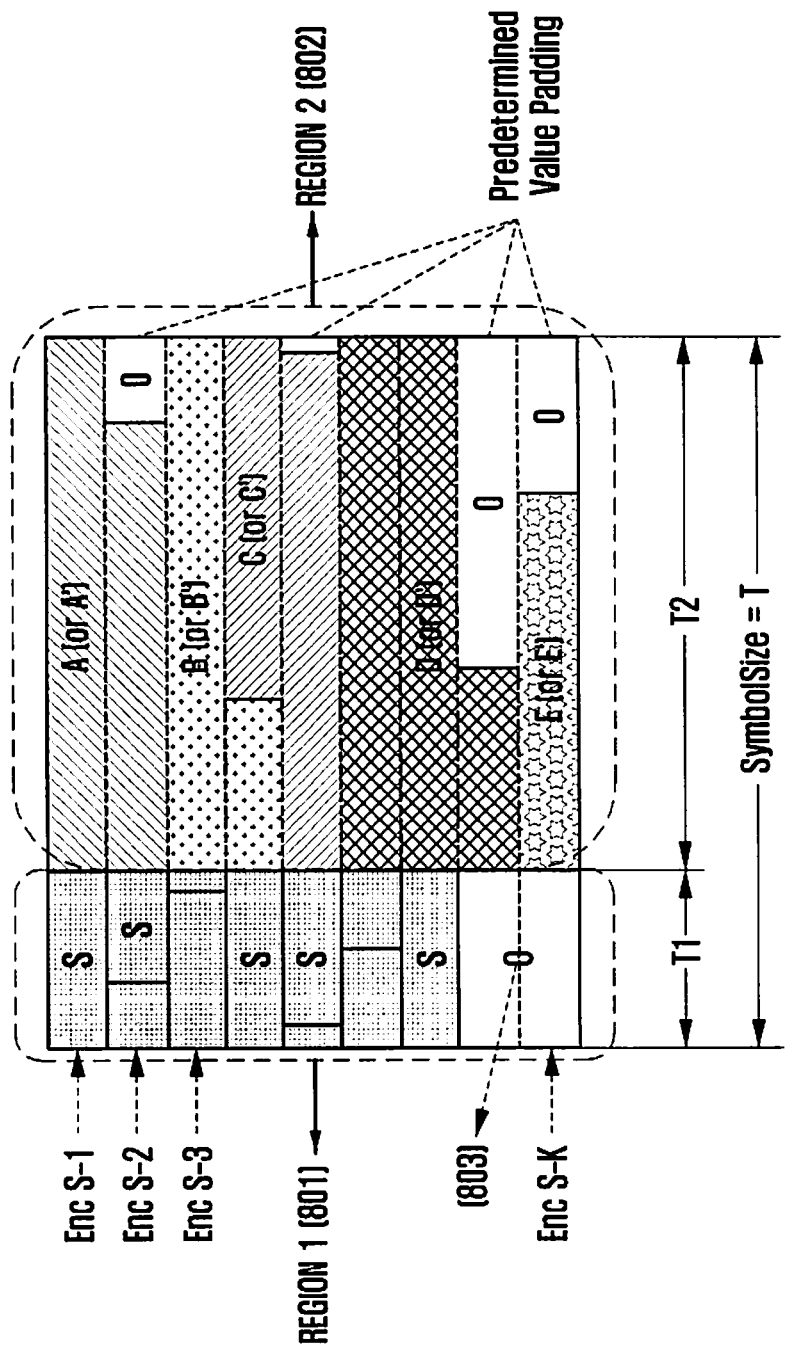
FIG. 8 illustrates a packet arrangement method according to an embodiment of the present invention.

FIG. 8 illustrates a packet arrangement method according to an embodiment of the present invention.

Referring to FIG. 8, after the value of T1 has been determined, the data 308 including Flow ID and length information or partial data of the source packet 307 is sequentially arranged in a row direction in the region 1 801. Typically, the supplementary information, i.e., the Flow ID and length information, included in the data 308 is arranged in the same order as the source packets or partial source packets in the region 2 802. Therefore, after all of the source packets have been arranged, zero padding 803 is inserted. Typically, R_padding is set to an appropriate value to make the zero padding 803 small enough for the entire source block size, i.e., the zero padding gives no significant influence to the source block size.

After the above described data arrangement procedure for the region 1 801 and region 2 802 has been determined, the source block configuration procedure is performed as follow.

Step 1) The transmission apparatus 100 arranges a predetermined number of source packets with sequence numbers in the region 2 802 according to the rule decided based on the predetermined value of T2. If necessary, zero padding may be inserted in the arrangement procedure.

Step 2) The transmission apparatus 100 calculates the value of T1 and the range of the region 1 on the basis of the number of symbols K which has been determined after step 1) and the minimum limit ratio of zero padding R_padding of the region 1 801 which has been set by the system.

Step 3) The transmitter 100 arranges the supplementary information on the source packets in the region 1 801 in the same order as the source packets arranged in the region 2 802.

The method for determining the source packets to be arranged in the region 2 802 of a source block is not described in step 1) of the source block configuration procedure herein. The method for determining the source packets corresponding to a source block depends on the system.

In accordance with an embodiment of the invention, the value of T2 has been given and the maximum value of source symbol in source block K_max also has been given in the system. Assuming that the source packets are arranged in region 2 802 according to <Rule 2> or <Rule 4>, the size of the data for the source packets in region 2 802 should not exceed the size of region 2 802, i.e. T2*K_max bytes. The number of source packets corresponding to the resource block region 2 802 can be determined by arranging a maximum number of source packets in region 2 802 while the size of the data for the source packets in region 2 802 does not exceed the size of region 2 802. However, the method for determining source packets or number of source packets according to the present invention is not limited thereto.

The transmission apparatus 100 configures the source blocks with a predetermined number of source packets having sequence numbers and generates a predetermined number of repair symbols (or packets) having sequence numbers by performing FEC encoding on the source block. Here, the size of the repair symbol is T, which is equal to the size of the source symbol.

Figure 9:
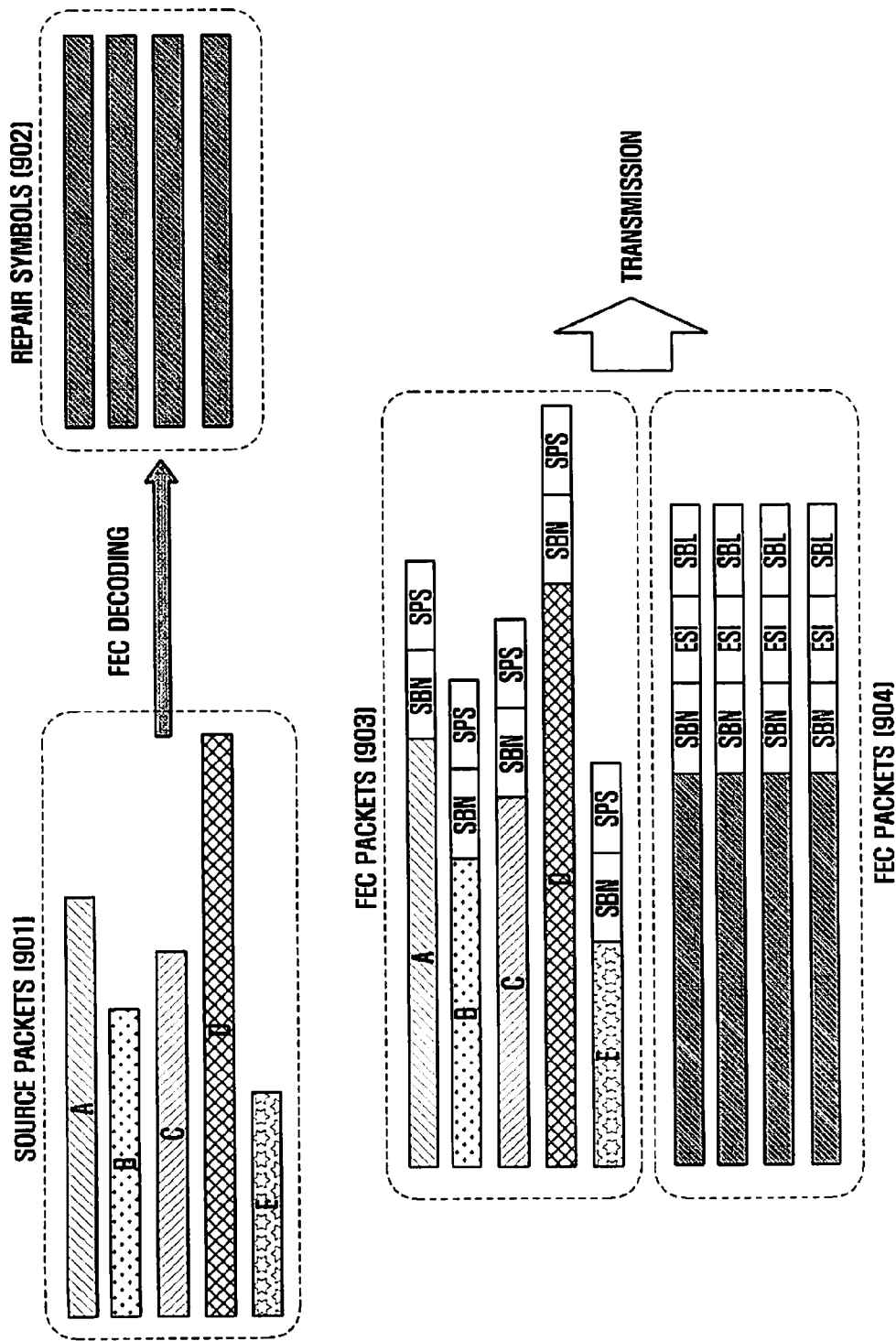
FIG. 9 illustrates an FEC packet generation procedure according to an embodiment of the present invention.

FIG. 9 illustrates an FEC packet generation procedure according to an embodiment of the present invention.

Referring to FIG. 9, the source packets 901 and repair symbols 902 are packetized to be transmitted. The FEC packets 903 are generated by adding Source FEC Payload ID to the source packets 901. The FEC packets 904 are generated by adding Repair FEC Payload ID to one or more of the repair symbols 902. The packetized FEC packets 903 and 904 are then transmitted.

Here, the Source FEC Payload ID of the FEC packets 903 include a Source Block Number (SBN) and a Source Packet Sequence (SPS), respectively. The SPS is assigned a Sequence number for an FEC packet sequence.

The Repair FEC Payload ID of the FEC packets 904 includes an SBN, an Encoding Symbol ID (ESI), and a Source Block Length (SBL). The ESI includes the repair symbol IDs for FEC decoding in region 1 301. The SBL includes the information on the number of source packets of the source block. It is noted that the FEC packet 903 and 904 do not include the supplementary data 308 arranged in the region 1 301 of the source block. That is, the supplementary data 308 is used only when generating the source block and repair symbols 902 because the Flow ID or the length information of the source packets 901 arranged in the region 2 302 are the data generated in forming the UDP packet and, if the UDP packets are received without error, acquired with no apparent obstacle. Accordingly, it is typical that the supplementary information 308 is not included in the FEC packets 903 and 904.

A description will now made of the signaling information added to the source packet and repair packet according to an embodiment of the present invention in detail.

Referring again to FIGS. 3A and 3B, the SBN indicates the source block corresponding to the source packets 307 and the repair packets. The SPS is the sequence number assigned to each of the source packets arranged in the region 2 302. The ESI of the repair packet is the sequence number of the repair symbol including the repair packet. The SBL indicating the number of source packets included in the source block can be used to estimate the amount or length of the total supplementary information arranged in the region 1 301 and delimiting the boundary between the zero padding and the real data in performing FEC decoding on the region 1 301. For reference, the signaling is typically made with 2 to 3 bytes, but is not limited thereto.

Figure 10:
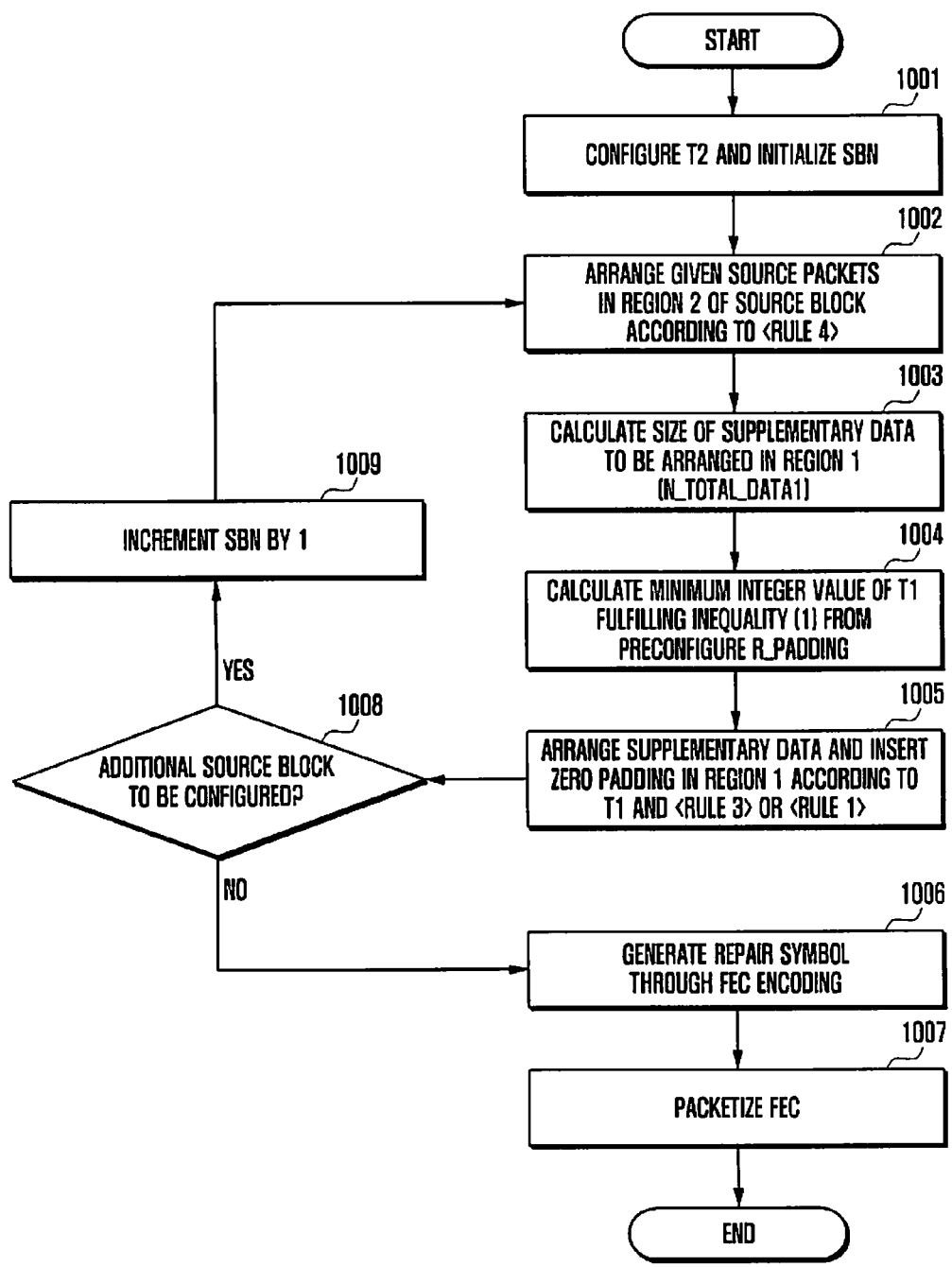
FIG. 10 is a flowchart illustrating a data transmission procedure according to an embodiment of the present invention.

FIG. 10 is a flowchart illustrating a data transmission procedure of a transmission apparatus according an embodiment of the present invention.

Referring to FIG. 10, the transmission apparatus configures the value of T2 and initializes an SBN in step 1001. In step 1002, the transmission apparatus arranges the source packets in the region 2 of the source block, according to the value of T2 and <Rule 4> (or <Rule 2>). After the source packets (or data packets) have been arranged in the region 2 completely in step 1002, the number of source symbols K is determined.

In step 1003, the transmission apparatus calculates N_Total_Data1, i.e., a size of the supplementary data for the source packets arranged in the region 2. For example, if the number of source packets arranged in the region 2 is N_packets and the size of the supplementary information about each source packet is 3 bytes, N_Total_Data1=3*N_Packet.

In step 1004, the transmission apparatus calculates the minimum integer value of T1 fulfilling the relationship of Inequity (1) from R_padding, i.e., the minimum zero padding ratio in the region 1. Basically, the size of the region 1 is determined in step 1004.

In step 1005, the transmission apparatus arranges the supplementary data in the region 1 according to T1 calculated in step 1004, a number of source symbols K, and <Rule 3> and, if necessary, inserts zero padding. When step 1005 has completed, a source block is generated.

Alternatively, steps 1003 and 1004 can be omitted depending on the system, and step 1005 can be changed according to the supplementary data arrangement scheme. For example, when the supplementary data is arranged in the region 1, if it is negotiated to perform the arrangement to fixe T1 to be the same as the supplementary data size by applying <Rule 1> as in FIG. 4 or 6, steps 1003 and 1004 can be omitted and step 1005 is replaced with a process of arranging the supplementary data in the region 1 according to <Rule 1>.

In step 1008, the transmission apparatus determines whether there is further data to be transmitted, i.e., whether to configure another source block. It another source block is required, the transmission apparatus increases SBN by 1 in step 1009. Thereafter, the transmission apparatus repeats steps 1002 to 1005, until all of the data to be transmitted is configured into source blocks.

When there is no further source block configuration to be performed, the transmission apparatus 100 performs FEC encoding on the generated source block to generate repair symbols in step 1006, and FEC packetization in step 1007.

For example, the FEC packetization includes inserting SBN and SPS to each source packet, packetizing the decoding symbol, and adding the signaling information, such as SBN, ESI, and SBL. For reference, the supplementary information, such as a Flow ID and length information, on the source packets to be arranged in the region 2 is not included in the source packet or repair symbol FEC packetization process.

Figure 11:
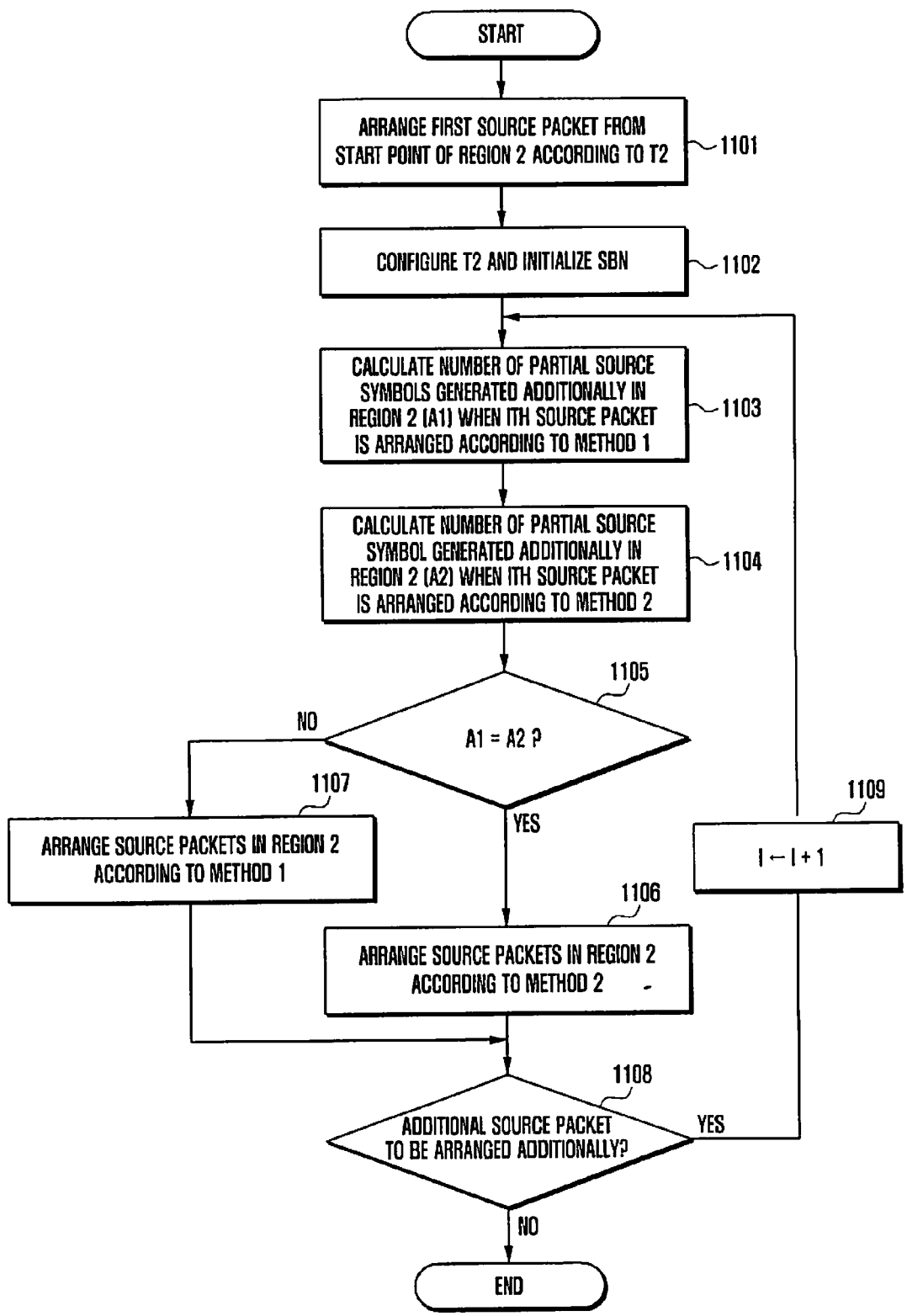
FIG. 11 is a flowchart illustrating a method for arranging source packets in a region of a source block, according to an embodiment of the present invention.

FIG. 11 is a flowchart illustrating a method for arranging source packets in a region of a source block, according to an embodiment of the present invention.

Referring to FIG. 11, the transmission apparatus arranges the first source packet to be arranged in a source block from the start point of the region 2, in step 1101, based on T2 determined in step 1001 of FIG. 10, according to <Rule 4>.

In step 1102, the transmission apparatus 100 initializes the source packet sequence index I=2, and in step 1103, calculates A1, i.e., the number of partial source symbols to be generated additionally in the region 2 802 when the source packets are arranged through Rule 4A for packet to be arranged at the I$^{th}$ order. Here, Rule 4A is subsequently accumulates the next source packet onto the previous source packet.

In step 1104, the transmission apparatus calculates A2, i.e., the number of partial source symbols generated additionally in region 2, when the source packets are arranged according to FIG. 4B for the source packet to be arranged at i$^{th}$ order. Here, Rule 4B arranges the next source packet from the start point of the partial source symbol (i.e., next row) next to the most recently arranged partial source symbol in the region 2, when source packet arrangement has completed. Alternatively, steps 1103 and 1104 can be switched in order.

In step 1105, the transmission apparatus compares A1 and A2, and when the two values are equal to each other, arranges the source packets in the region 2 according to Rule 4B in step 1106. However, when the two values are equal to each other, the transmission apparatus arranges the source packets in the region 2 according to Rule 4A, in step 1107.

In step 1108, the transmission apparatus determines whether there is further source packets to be arranged, and if there is no, ends the procedure. However, if there is another source packet to be arranged, the transmission apparatus increments I by 1 and the procedure returns to step 1103.

Because the value of I at the end of the procedure indicates the number of source packets to be arranged in the source block, it can be used as the value of SBL in the signaling information.

After the FEC packets have been generated as illustrated in FIGS. 10 and 11, the transmission apparatus transmits the packets. If some transmission packets corresponding to the source packets are lost during transmission and the reception apparatus has FEC packets corresponding to one or more repair symbols (or packet), it can recover the lost source packets through FEC decoding. The signaling information including SBN, ESI, and SBL used in generating the repair symbols and carried in the FEC packet corresponding to the repair symbol (or packet) can be used for reconfiguring the source block.

However, when the reception apparatus fails to acquire at least two of the partial symbol size T1 in region 1, the partial symbol size T2 in region 2, and the source symbol size T, it cannot recover the source block completely because the reception apparatus does not know the boundary of the source block and source symbol or partial source symbol size.

Because the parameters T1, T2, and T are not acquired from the FEC packets, they are transmitted from the transmission apparatus to the reception apparatus separately. However, it is not required to transmit the signaling information separately, when only the pre-negotiated T1, T2, and T are used. However, if these parameters are variable, the transmission apparatus transmits the signal information to the reception apparatus. The signaling information may be carried in the FEC packets, however, the transmission apparatus is also capable of transmitting the signaling information using a separate system signaling method.

If two of T1, T2, and T are known, the other one can be acquired through the relationship of T1+T2=T and thus, it is not necessary to signal all of T1, T2, and T.

Also, if the total number of source symbols K is not known, the boundary between the source and repair symbols can not be clearly identified. Accordingly, K is transmitted or signaling information for estimating K is transmitted.

The number of source symbols K can be included in the signaling information carried by the FEC packet or transmitted using a separate signaling method.

The transmission apparatus is also capable of transmitting an encoding ID according to the characteristic of the FEC code applied to the FEC decoding, in order for the reception apparatus to estimate K, rather than signaling K directly.

Figure 12:
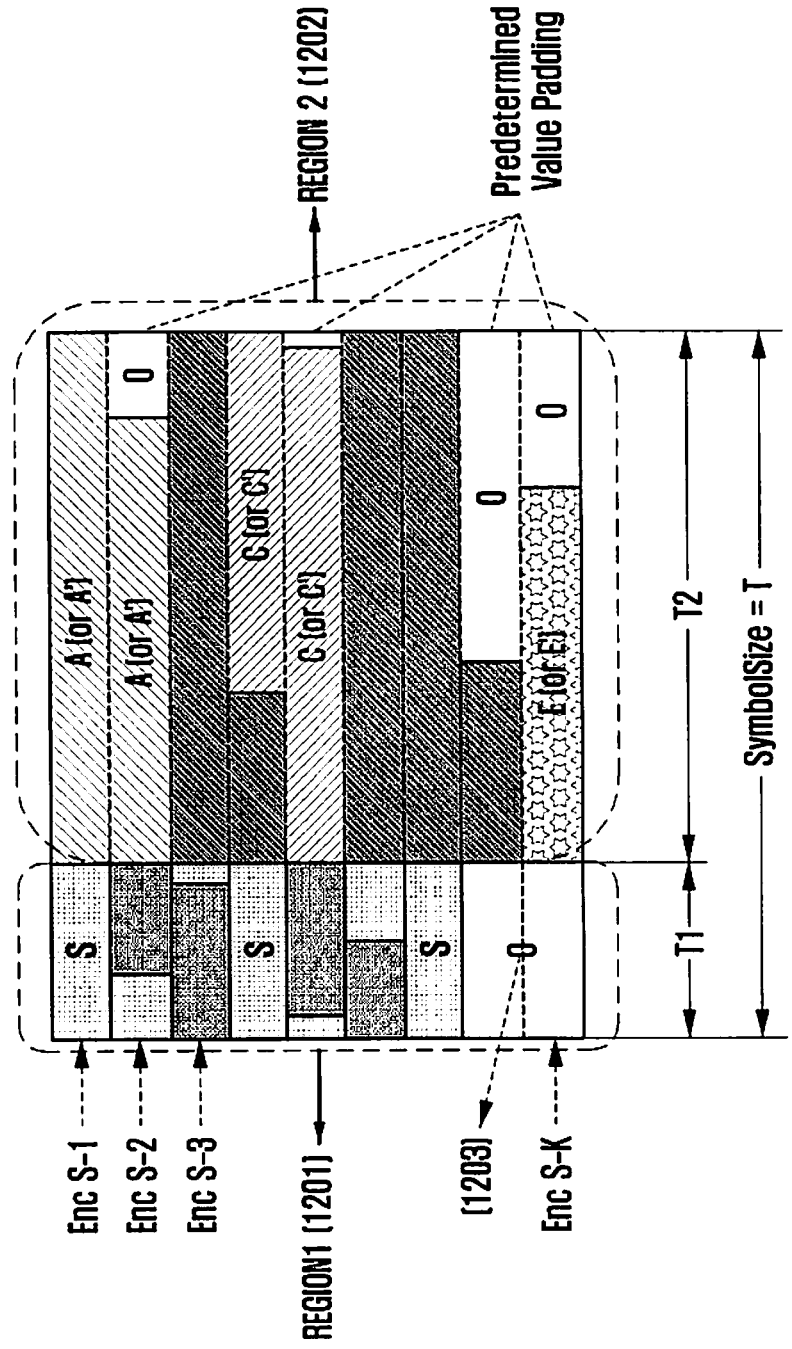
FIG. 12 illustrates source packet loss according to an embodiment of the present invention.

FIG. 12 illustrates source packet loss according to an embodiment of the present invention. In FIG. 12, it is assumed that the FEC packets have been FEC-encoded transmitted in the format of the source block as illustrated in FIG. 8 and the second and fourth FEC packets have not been received. Further, it is assumed that the reception apparatus has acquired T1, T2, T, and K.

In order for the reception apparatus to perform FEC decoding with lost packets, at least 1 repair packet is required. Because the packet recovery is impossible with no repair packet, FEC decoding is not considered in such a situation. If at least one repair packet is received, the reception apparatus checks N_packet, i.e., the number of source packets, included in the block of FIG. 12, based on an SBL of the signaling information carried in the repair packet. Because the size of the supplementary information is pre-negotiated, the reception apparatus checks the arrangement of supplementary information and zero padding, as illustrated in region 1 1201 of FIG. 12 using T1 and N_packet values. If specific source packets are lost in the region 1 1201, the SPS of the lost packet is also missing, such that the reception apparatus handles the supplementary information at the position corresponding to the missing SPS as lost information.

Once the supplementary information arrangement of region 1 1201 is checked, the reception apparatus performs FEC decoding on the region 1 1201. The FEC decoding can be performed in units of partial symbols or bytes according to the system configuration. Because the region 1 1201 has the zero padding 1203, it is possible to perform FEC decoding the region 1 1201 with superior decoding performance and high decoding accuracy, based on the known information.

After the region 1 1201 has been decoded, the lost supplementary information can be recovered, so as to check the source packet configuration in the region 2 1202. For example, if the supplementary information indicates the lengths of the source packets arranged in the region 2 1202, it is possible to check the arrangement of the source packets, as illustrated in the region 1202, according to <Rule 2> or <Rule 4>, and the value of T2. In this case, because the length information on the missing source packet is recovered by decoding the region 1 1201 successfully, it is possible to accurately check the positions of the lost source packets.

After the packet arrangement in the region 2 1020 has been checked, the reception apparatus performs FEC decoding on the region 2 1202. The FEC decoding can be performed in units of partial symbols or bytes. The FEC decoding on the region 2 1202 can be performed with the same FEC code or a different FEC code from the FEC code used in the FEC decoding on the region 1 1201. Because the region 2 1202 is configured with a part of zero padding, the decoding performance degrades a little at the region 2 1202, as compared to the region 1 1201. Accordingly, if the FEC decoding at the region 1 1201 fails, it is likely that decoding in the region 2 1202 will also fail, resulting in failure of lost source packets. However, because the zero padding is configured to maintain high decoding success probability at the region 1 1201, such a decoding failure rarely occurs.

Figure 13:
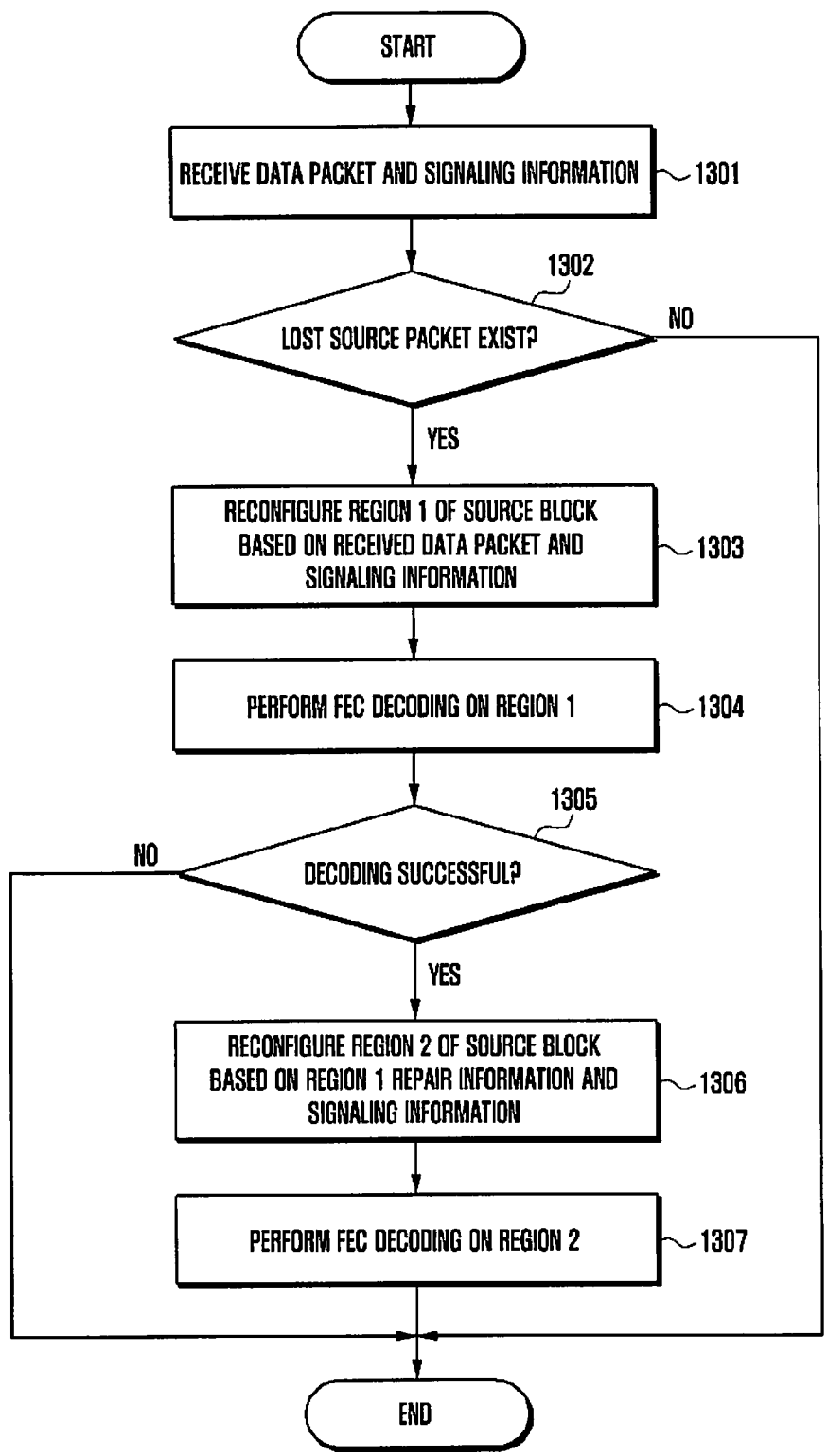
FIG. 13 is a flowchart illustrating a packet recovery procedure according to an embodiment of the present invention.

FIG. 13 is a flowchart illustrating a packet recovery procedure of a reception apparatus according to an embodiment of the present invention.

Referring to FIG. 13, the reception apparatus receives the data packets, such as FEC packets, and signaling information in step 1301. In step 1302, the reception apparatus determines whether there is a lost source packet.

If there is no lost source packet, FEC decoding does not have to be performed, and thus, the reception apparatus ends the recovery procedure. However, if there is a lost source packet, the reception apparatus reconfigures the region 1 1201 of the source block using the received source packets and signaling information in step 1303. The reconfiguration of the region 1 follows predetermined <Rule 1> or <Rule 3>.

In step 1304, the reception apparatus performs FEC decoding on the reconfigured region 1 1201. In step 1305, the reception apparatus determines whether the FEC decoding on the region 1 1201 is successful, and if decoding the region 1 1201 fails, this means that the source packet recovery is impossible and the recovery procedure is ended. However, if the FEC decoding on the region 1 1201 is successful, the reception apparatus reconfigures the region 1 1202 in the resource block using the information recovered from the region 1 1201 and signaling information in step 1306. The reconfiguration of the region 2 1201 follows <Rule 2> or <Rule 4>.

In step 1307, the reception apparatus performs FEC decoding on the reconfigured region 2 1202 and then ends the recovery procedure.

Figure 14:
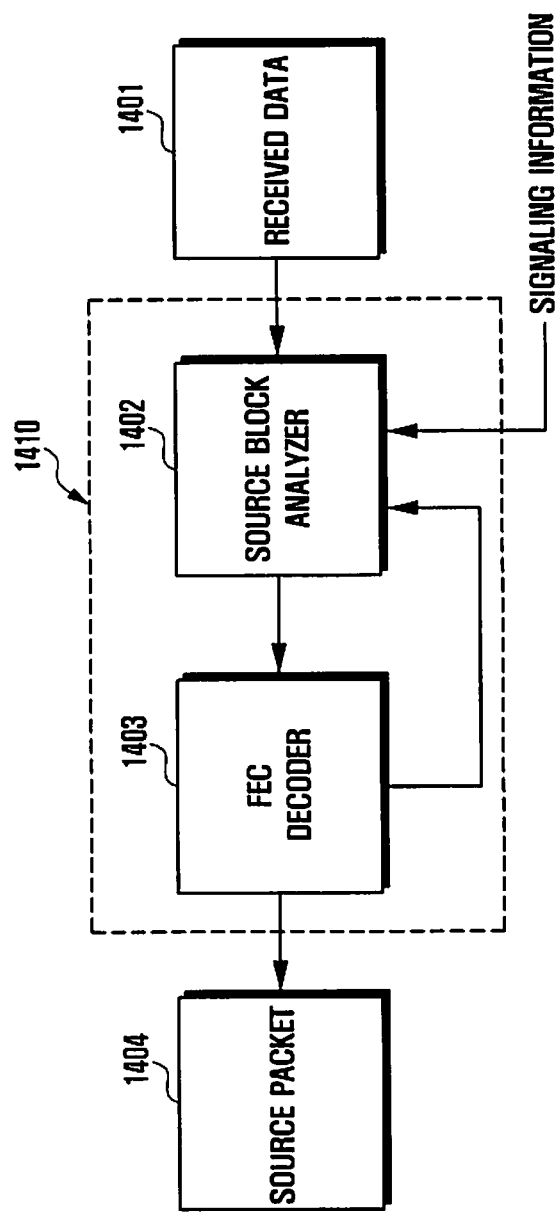
FIG. 14 illustrates a reception apparatus according to an embodiment of the present invention.

FIG. 14 illustrates a reception apparatus according to another embodiment of the present invention.

Referring to FIG. 14, the reception apparatus 1410 includes a source block analyzer 1402 and an FEC decoder 1403. The source block analyzer 1402 analyzes the data arrangement in a region 1 of the source block to reconfigure, and the FEC decoder 1403 performs FEC decoding on the reconfigured region 1 and some of repair symbols to recover the data in the region 1. The recovered data of the region 1 is delivered back to the source block analyzer 1402, which analyzes the data arrangement in the region 2 of the source block and reconfigures the region 2, and the FEC decoder 1403 performs FEC decoding on the reconfigured region 2 and some of the repair symbols to recover the data of the region 2 1202, thereby recovering the source packets. The source block analyzer 1402 analyzes the data arrangement of each region based on the signaling information 1405, which can be received with the data 1401 or acquired separately.

As described above, a data packet transmission/reception apparatus and method in accordance with any of the above-described embodiments of the present invention are advantageous in efficiently recovering data loss that has occurred during transmission, improve error correction capability while reducing the amount of zero padding.

Although certain embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims and their equivalents.

What is claimed is:

1. A packet transmission method comprising:
arranging information of a first transmission packet in a first region of a source block and arranging a first source symbol of the first transmission packet in a second region of the source block;
arranging information of a second transmission packet in the first region of the source block and arranging a second source symbol of the second transmission packet in an empty space after the first source symbol of the first transmission packet;
performing Forward Error Correction (FEC) encoding on the source block; and
transmitting the encoded source block,
wherein, a remaining space of the first region is padded with a predetermined value after the information of the first transmission packet and the second transmission packet are arranged, and
wherein a remaining space of the second region is padded with a predetermined value after the first source symbol and the second source symbol are arranged.

2. The packet transmission method of claim 1, wherein arranging each of the comprises:
counting a number of required rows (N) for the first source symbol;
counting a number of required rows (M) for the second source symbol; and
if the required rows (N) is equal to the required rows (M), designating a start point of each of the first source symbol and the second source symbol at an end of a previously arranged transmission packet, and if the required rows (N) is less than the required rows (M), designating a start point of each of the first source symbol and the second source symbol on a next row of the previously arranged source packet.

3. The packet transmission method of claim 1, wherein a size of the source block is a predetermined value, and
wherein a size of the first region of the source block is a determined minimum integer based on the equation:

$$T1 \geq N\_Total\_Data1/((1-R\_padding) \times K) \ldots,$$

wherein T1 is the first region of the source block size, N_Total_Data1 is the total size of a transmission packet to be arranged in the second region of the source block, R_padding is the predetermined value, and the K is a number of the transmission packets.

4. The packet transmission method of claim 1, wherein the information of each of the first and second transmission packets comprises:
a length and an identifier of each of the the first and second transmission packets.

5. A packet transmission apparatus comprising:
a source block generator configured to arrange information of a first transmission packet in a first region of a source block and arranging a first source symbol of the first transmission packet in a second region of the source block;
a Forward Error Correction (FEC) encoder configured to perform FEC encoding on the source block; and
a transmitter configured to transmit the encoded source block,
wherein, a remaining space of the first region is padded with a predetermined value after the information of the first transmission packet and the second transmission packet are arranged, and
wherein a remaining space of the second region is padded with predetermined value after the first source symbol and the second source symbol are arranged.

6. The packet transmission apparatus of claim 5, wherein the source block generator is further configured to:
count a number of required rows (N) for the first source symbol;
count a number of required rows (M) for the second source symbol; and
if the required rows (N) is equal to the required rows (M), designating a start point of each of the first source symbol and the second source symbol at an end of a previously arranged transmission packet, and if the required rows (N) is less than the required rows (M), designating a start point of each of the first source symbol and the second source symbol on a next row of the previously arranged transmission packet.

7. The packet transmission apparatus of claim 5, wherein the source block generator is further configured to:
receive a predetermined value relating to a size of source block,
determine a size of the first region of the source block based on the equation:

$$T1 \geq N\_Total\_Data1/((1-R\_padding) \times K) \ldots,$$

wherein T1 is the first region of the source block size, N_Total_Data1 is the total size of a transmission packet to be arranged in the second region of the source block, R_padding is the predetermined value, and K is a number of transmission packets.

8. The packet transmission apparatus of claim 5, wherein the information of each of the first and second transmission packets comprises:
a length and an identifier of each of the the first and second transmission packets.

* * * * *